United States Patent [19]
Kasperkovitz et al.

[11] Patent Number: 5,221,911
[45] Date of Patent: Jun. 22, 1993

[54] RECEIVER HAVING PLL FREQUENCY SYNTHESIZER WITH RC LOOP FILTER

[75] Inventors: Wolfdietrich G. Kasperkovitz; Hubertus H. M. Vereijken, both of Eindhoven, Netherlands

[73] Assignee: U.S. Philips Corporation, New York, N.Y.

[21] Appl. No.: 898,773

[22] Filed: Jun. 12, 1992

[30] Foreign Application Priority Data

Jun. 21, 1991 [EP] European Pat. Off. ........ 91201594.8

[51] Int. Cl.$^5$ .......................... H03L 7/093; H04B 1/26
[52] U.S. Cl. .......................... 331/17; 331/25; 455/260; 455/316
[58] Field of Search .................. 331/17, 25; 455/260, 455/316

[56] References Cited

U.S. PATENT DOCUMENTS

| | | | |
|---|---|---|---|
| 3,316,497 | 4/1967 | Brooks | 331/17 |
| 3,810,046 | 5/1974 | Lance | 331/17 X |
| 4,837,853 | 6/1989 | Heck | 455/260 X |
| 4,952,888 | 8/1990 | Izumi | 331/17 X |

Primary Examiner—Siegfried H. Grimm
Attorney, Agent, or Firm—Edward W. Goodman

[57] ABSTRACT

A receiver having an RF section, a mixer stage and a signal processing stage, the mixer stage receiving a mixing frequency from a frequency synthesis circuit which includes a phase-locked loop provided with a phase detection device having a current output, a loop filter including a $\pi$-shaped RC network having an input shunt path and an output shunt path which are connected to respective ends of a series resistor incorporated in a series path, and to ground, and include first and second capacitances, respectively, and with a voltage-controlled oscillator, a reference frequency being applied to the phase detection device. In order to prevent the use of active filter circuits in the phase-locked loop of such a receiver, the second capacitance is chosen to be at least twice as large as the first capacitance, the series resistance is chosen to be smaller than the output impedance of the phase detection device and the output shunt path of the loop filter is provided with an RC phase shift member for reducing the phase shift of the second capacitance in the output shunt path.

5 Claims, 1 Drawing Sheet

RECEIVER HAVING PLL FREQUENCY SYNTHESIZER WITH RC LOOP FILTER

BACKGROUND OF THE INVENTION

1. Field of the Invention

The invention relates to a receiver comprising an RF section, a mixer stage and a signal processing section, said mixer stage receiving a mixing frequency from a frequency synthesis circuit which comprises a phase-locked loop provided with a phase detection device having a current output, a loop filter comprising a π-shaped RC network having an input shunt path and an output shunt path which are connected to respective ends of a series resistor incorporated in a series path, and to ground and comprise first and second capacitances, respectively, and with a voltage-controlled oscillator, a reference frequency being applied to said phase detection device.

2. Description of the Related Art

A phase-locked loop for use in a frequency synthesis circuit of such a receiver is known per se, for example from U.S. Pat. No. 3,316,497.

In the known phase-locked loop, the controlled oscillator is coupled to the phase detection device via a frequency divider. The reference frequency is also applied to the phase detection device from, for example, a crystal oscillator. In the phase-locked state of the loop, phase difference between the frequency-divided oscillator signal, on the one hand, and the reference frequency, on the other hand, are converted in the phase detection device into a phase difference signal which is negatively fed back in the loop from the output to the input of the phase detection device and is thereby suppressed. As a result, an accurate phase synchronization of the frequency-divided oscillator signal with the reference frequency takes place in this phase-locked state and the oscillator frequency is a factor determined by the dividend or division factor of the frequency divider multiplied by the reference frequency. By varying said dividend, the oscillator frequency, which is applied as a mixing frequency to the mixer stage, can be adjusted to a desired tuning frequency.

For a correct operation of the phase-locked loop, the loop parameters should satisfy conflicting requirements: for example, the loop selectivity is to be chosen as large as possible for a maximal phase synchronization. However, a large loop selectivity is accompanied by a large phase shift which jeopardizes the loop stability. The impedance levels should also be noiselessly adjusted to correct values so as to prevent the loop circuits from influencing each other.

In the known phase-locked loop, use is made of active filter sections for this purpose, which, together with said π-shaped RC network, form part of a loop filter. In these active filter sections, capacitances, series resistors and operational amplifiers ar used for amplifying and selecting a dc control signal for the voltage-controlled oscillator. Particularly because of the series resistors and the amplifiers, the use of such active filter sections in a phase-locked loop introduces a number of unwanted effects in the loop, such as:

the occurrence of unwanted sideband signals around the oscillator frequency at intervals with the order of magnitude of the reference frequency, caused by leakage currents in the amplifiers;

an unwanted frequency modulation of the oscillator signal as a result of insufficient suppression of power supply voltage variations or ripple in the amplifiers;

noise which becomes manifest as an unwanted sideband noise in the oscillator signal.

SUMMARY OF THE INVENTION

It is an object of the invention to provide a receiver having a phase-locked loop in which an adequate loop selectivity and loop stability is obtained without the afore-mentioned unwanted effects accompanying the use of active filter sections.

According to the invention, a receiver of the type described in the opening paragraph is therefore characterized in that the second capacitance is at least twice as large as the first capacitance, the series resistance is smaller than the output impedance of the phase detection device and the output shunt path of the loop filter is provided with an RC phase shift member.

The invention is based on the recognition that an effective low-noise selection of the oscillator control signal, while maintaining a sufficient loop stability with a passive loop filter, is very well possible by realizing the phase margin increase required for an adequate loop stability as well as the current-voltage conversion, i.e. the integration of the phase difference signal supplied by the phase detection device, substantially after the selection of said phase difference signal.

When using the measure according to the invention, only passive elements are used between the current output of the phase detection device and the voltage input of the controlled oscillator. A low-pass selectivity is obtained by means of the capacitance of the input shunt path and the series resistor. Integration of the output current signal of the phase detection device and a further increase of the low-pass selectivity is substantially realized by means of the second capacitance. The impedance of the input shunt path is then significantly larger than the impedance of the output shunt path. As a result the resistance noise voltage ($4\sqrt{KTR}$) of the series resistor is divided over the input shunt path and the output shunt path which is arranged parallel to the control input of the controlled oscillator. As a result, only a very small part of said noise voltage is applied to the controlled oscillator.

The 90° phase shift occurring across the second capacitance is reduced in a low-noise manner by incorporating the RC phase shift member in the output shunt path. This reduction of the phase shift, also referred to as phase lead, is used to obtain a sufficiently large loop stability.

A first preferred embodiment of a receiver according to the invention is characterized in that the RC member comprises a parallel arrangement of a resistor and a capacitance which is arranged in series with the second capacitance.

A second preferred embodiment of a receiver according to the invention is characterized in that the RC member comprises a series arrangement of a resistor and a capacitance which is arranged in parallel with the second capacitance.

To be able to rapidly follow frequency jumps in the reference frequency without any loss of loop stability, a further preferred embodiment is characterized in that a pair of anti-parallel connected diodes is arranged in parallel across the series resistor.

BRIEF DESCRIPTION OF THE DRAWING

The invention will be described in greater detail with reference to the FIGS. shown in the drawing, which FIGS. only serve the purpose of illustrating the invention.

In this drawing.

DESCRIPTION OF THE PREFERRED EMBODIMENTS

Figure 1:
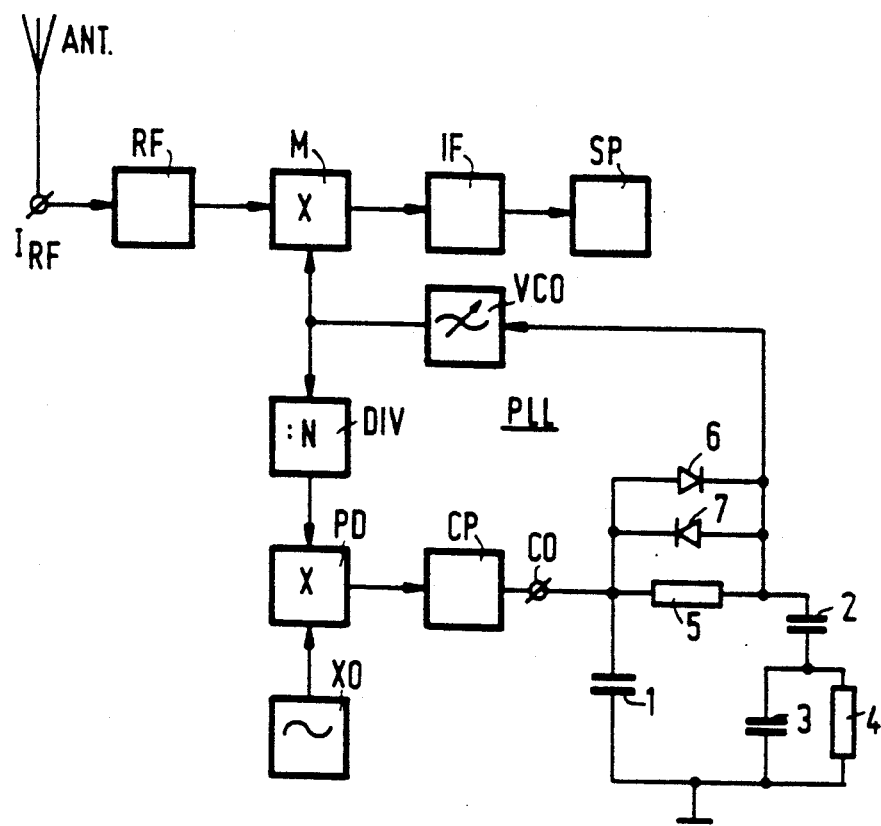
FIG. 1 shows a receiver according to the invention.

FIG. 1 shows a receiver according to the invention, having an RF antenna input $I_{RF}$ in the receiver are an RF input section RF, a mixer stage M, an antenna input $I_{RF}$ in the receiver are an RF input section RF, a mixer stage M, an intermediate frequency circuit/demodulator unit IF and a baseband signal processing and reproducing device SP. A mixing frequency or a local mixing carrier is applied to the mixer stage M from a frequency synthesis circuit, this local mixing carrier being tunable in frequency to a tuning frequency which deviates over an intermediate frequency from a desired transmitter frequency. With the aid of this local mixing carrier, it is possible to convert a desired RF reception signal, which is applied to the mixer stage M via the antenna ANT and the RF input section RF, into an intermediate frequency (IF) signal on an IF carrier of, for example 10.7 MHz. In the IF circuit/demodulator unit IF, said IF signal is demodulated after IF selection and amplification, which results in a baseband signal. This baseband signal is subsequently further processed and reproduced in known manner in the baseband signal processing and reproducing device SP.

The frequency synthesis circuit comprises a phase-locked loop PLL which incorporates a controlled oscillator VCO, an output of which is coupled to a phase detector PD of a phase detection device via a frequency divider circuit DIV. The frequency divider circuit DIV divides the frequency of the output signal of the controlled oscillator VCO by a controllable division factor N. A reference frequency $f_{ref}$ is applied to the phase detector PD form a crystal oscillator XO. the phase detection device also includes a charge pump CP functioning as a voltage-current converter which is coupled to the output of the phase detector PD and converts voltage pulses occurring in the output signal of the phase detector PD into current pulses. These current pulses are supplied by the voltage-current converter CP to a current output CO of the phase detection device which is coupled to a loop filter 1-7. As will be described hereinafter, the loop filter 1-7 realizes a substantially noiseless conversion of the pulsatory outlet current signal at the current output CO into a varying dc control voltage and a selection thereof without jeopardizing the loop stability. This control voltage is applied to a control input of the controlled oscillator VCO for controlling the frequency and/or phase of the oscillator signal.

In the operating range of the phase-locked loop PLL, the frequency and phase differences between the reference frequency $f_{ref}$ and the oscillator frequency of the controlled oscillator VCO divided in frequency by means of the division factor N or the frequency divider circuit DIV are negatively fed back. As a result a phase synchronization is obtained eventually after a frequency synchronization, with the phase of said frequency-divided oscillator frequency of the controlled oscillator VCO being controlled to be accurately equal to that of the reference frequency $f_{ref}$ in the phase-locked state of the phase-locked loop PLL. the controlled oscillator VCO then supplies an oscillator frequency which is N times the reference frequency $f_{ref}$. Since the factor N is controllable, the oscillator signal applied as a mixing frequency to the mixer stage M by the oscillator VCO can be tuned to a desired tuning frequency by varying this factor N.

The loop filter 1-7 only uses passive elements and comprises a $\pi$-shaped RC network having an input shunt path and an output shunt path which are connected to respective ends of a series resistor 5 incorporated in a series path, and to ground, said first shunt path incorporating a first capacitance 1 and said second shunt path incorporating a second capacitance 2 which is arranged in series with a parallel RC phase shift member 3,4. This parallel RC phase shift member 3, 4 incorporates a third capacitance 3 which is arranged parallel to a resistor 4. The second capacitance 2 is chosen to be at least twice as large as the first capacitance 1, while the series resistance is chosen to be smaller than the output impedance of the voltage-current converter CP. The cut-off frequency determined by the series resistor 5 and the first capacitance 1 is chosen to be several times larger than the reference frequency $f_{ref}$. As a result a current-voltage conversion or an integration of the current pulses supplied by CP is substantially realized across the second capacitance 2. Since the first capacitance 1 has a comparatively small value, it is charged fairly rapidly by the output current pulses of the voltage-current converter CP, while, for the chosen dimensioning, a voltage is applied across the series resistor 5 which is substantially equal to the voltage across the first capacitance 1. The relatively large capacitance 2 is gradually charged via this series resistor 5, i.e. via a ramp function. Consequently, the current-voltage conversion substantially takes place in this second capacitance 2. Simultaneously the second capacitance 2 reduces interference components, inter alia those having a frequency which is equal to the reference frequency $f_{ref}$ or its harmonics.

Due to the comparatively small value of the first capacitance 1, the input shunt path has a comparatively high impedance. The series resistor 5 can be considered as a noise voltage source which supplies a thermal noise voltage of $4\sqrt{KTR}$. This thermal noise voltage spreads over the output impedance of the voltage-current converter CP, on the one hand, and the input impedance of the controlled oscillator VCO, on the other hand. Since the voltage-current converter CP has a comparatively high output impedance, substantially the entire noise voltage will be present across the input shunt path and substantially no noise voltage is applied to the controlled oscillator VCO.

The RC phase shift member 3, 4 reduces the phase shift which is produced across the second capacitance 2 and hence increases the phase margin which is necessary to obtain a sufficiently large loop stability. For this purpose the values of the third capacitance 3 and the resistor 4 are to be chosen in such a way that the cut-off frequency determined by these elements 3 and 4 is of the order of the reference frequency $f_{ref}$. Preferably, the value of the resistor 4 should be approximately half that of the series resistor 5.

For an effective phase correction by means of the RC phase shift member 3, 4, its impedance should be low-ohmic at the reference frequency $f_{ref}$, which is achieved in the case of the chosen dimensioning. Consequently, this RC phase shift member 3, 4 acts as a phase lead network around $f_{ref}$ and for frequencies which are smaller than $f_{ref}$. As regards the second shunt path 2-4, it is to be noted that for a good noise behavior, there should not be a dc path to ground across this second shunt path.

Figure 2:
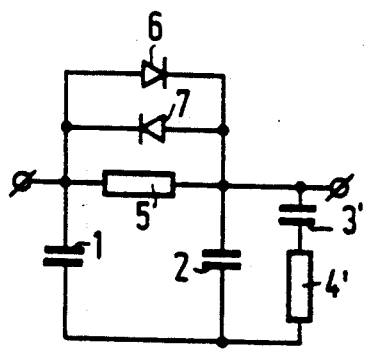
FIG. 2 shows an alternative embodiment of the loop filter for use in the receiver of FIG. 1.

An alternative embodiment of the loop filter 1-7 is shown in FIG. 2, which differs from FIG. 1 in the way in which the second shunt path 2-4 is implemented. In the loop filter shown in FIG. 2, the RC phase shift member is constituted by a series arrangement of a capacitance 3' and a resistor 4'. The RC phase shift member 3', 4' is arranged parallel to the second capacitance 2.

As already noted hereinbefore, the voltage across the second capacitance 2, operating as an integrator, gradually increases in the phase-locked state of the loop. In order to be able to realize a rapid phase lock after step-wise changes of the division factor N of the frequency divider circuit DIV, the series resistor 5 is shunted by a pair of anti-parallel connected diodes 6, 7 which realize a short and rapid charge and discharge, respectively, of the second capacitance 2. In view of the location of the RC phase shift member, the loop stability is ensured during the step-wise variations of the oscillator control signal caused by these rapid charges and discharges.

In a practical embodiment of the receiver shown in FIG. 1 as an FM receiver, a reference frequency $f_{ref}$ of 25 kHz was used, the cut-off frequency determined by the first capacitance 1 and the series resistor 5 was two to five times the reference frequency, the resonant frequency formed by the second capacitance 2 and the first resistor 4 was smaller than the reference frequency $f_{ref}$, the resonant frequency determined by the first resistor 4 and the third capacitance 3 of the RC phase shift member 3, 4 was of the order of the reference frequency $f_{ref}$ or was slightly above it, and the series resistor 5 had a value which was chosen to be approximately twice as high as that of the first series resistor 4.

We claim:

1. A receiver comprising an RF section, a mixer stage and a signal processing section, said mixer stage receiving a mixing frequency from a frequency synthesis circuit which comprises phase-locked loop provided with a phase detection device having a current output, a loop filter comprising a $\pi$-shaped RC network having an input shunt path and an output shunt path which are connected to respective ends of a series resistor, incorporated in a series path and to ground and comprise first and second capacitances, respectively, and with a voltage-controlled oscillator, a reference frequency being applied to said phase detection device, characterized in that the second capacitance is at least twice as large as the first capacitance, the series resistance is smaller than the output impedance of the phase detection device and the output shunt path of the loop filter is provided with an RC phase shift member for reducing the phase shift of the second capacitance in the output shunt path.

2. A receiver as claimed in claim 1, characterized in that the RC member comprises a parallel arrangement of a resistor and a capacitance which is arranged in series with the second capacitance.

3. A receive as claimed in claim 1, characterized in that the RC member comprises a series arrangement of a resistor and a capacitance which is arranged in parallel with the second capacitance.

4. A receiver as claimed in claim 1, characterized in that a pair of anti-parallel connected diodes is arranged in parallel across the series resistor.

5. A receiver as claimed in claim 2, characterized in that a pair of anti-parallel connected diodes is arranged in parallel across the series resistor.

* * * * *